(12) United States Patent
Weekamp et al.

(10) Patent No.: US 7,446,383 B2
(45) Date of Patent: Nov. 4, 2008

(54) ELECTRONIC DEVICE MOUNTABLE ONTO A SUBSTRATE USING SURFACE MOUNT TECHNIQUES, AND METHOD

(75) Inventors: Johannus Wilhelmus Weekamp, Eindhoven (NL); Mark Hermanus Gortemaker, Nijmegen (NL); John Antoine Peters, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/571,627

(22) PCT Filed: Aug. 30, 2004

(86) PCT No.: PCT/IB2004/051598

§ 371 (c)(1),
(2), (4) Date: Mar. 14, 2006

(87) PCT Pub. No.: WO2005/026761

PCT Pub. Date: Mar. 24, 2005

(65) Prior Publication Data

US 2007/0074907 A1   Apr. 5, 2007

(30) Foreign Application Priority Data

Sep. 16, 2003 (EP) .................................. 03103393

(51) Int. Cl.
*H01L 29/82* (2006.01)
(52) U.S. Cl. ........................ 257/421; 257/701; 257/723; 257/730; 257/731

(58) Field of Classification Search ......... 257/421–427, 257/734, 773–776, 779–784, 787–795, E43.004, 257/E23.002, E23.003, E23.007, E23.01, 257/E23.011, E23.012, E23.116, E23.117, 257/E23.119, E23.123, E23.124, E23.169, 257/E23.172, E23.175; 438/106–112, 125–127; 174/520, 521, 525, 254, 255, 258–260
See application file for complete search history.

(56) References Cited

U.S. PATENT DOCUMENTS

| 3,581,387 A | * | 6/1971 | Buck et al. .................. 438/112 |
| 5,414,355 A |   | 5/1995 | Davidson |

(Continued)

*Primary Examiner*—Zandra Smith
*Assistant Examiner*—Paul E Patton
(74) *Attorney, Agent, or Firm*—Michael E. Belk (57) ABSTRACT

The sensing device (100) comprises a first sensing element (10) having a reference plane (1), between which sensing element (10) and a contacting side (3) of the device (100) a predefined angle is present. Conductors couple the sensing element (10) to external contacting means (30). The sensing device (100) is further provided with a body (21), which encapsulates the first sensing element (10) and at the same time acts as a carrier for the conductors, so that the contacting side (3) is a face of the body (21). The sensing device (100) may contain more than one sensing element (10,20), which are by preference magneto-resistive sensors. It can be suitably manufactured in that parts (21A, 21B) of the body are rotated with respect to the contacting side (3), the parts (21A, 21B) of the body having complementary shapes.

14 Claims, 7 Drawing Sheets

U.S. PATENT DOCUMENTS

| | | |
|---|---|---|
| 5,646,446 A | 7/1997 | Nicewarner |
| 5,689,185 A | 11/1997 | Widdershoven |
| 5,776,797 A * | 7/1998 | Nicewarner et al. .......... 438/107 |
| 6,169,254 B1 * | 1/2001 | Pant et al. .................... 174/254 |
| 6,172,418 B1 | 1/2001 | Iwase |
| 6,304,082 B1 | 10/2001 | Stuible |
| 6,344,683 B1 | 2/2002 | Kim |
| 6,376,769 B1 * | 4/2002 | Chung ........................ 174/524 |
| 6,927,465 B2 * | 8/2005 | Smith et al. ................. 257/421 |
| 2002/0140422 A1 | 10/2002 | Bodin |
| 2002/0160548 A1 | 10/2002 | Fukunaka |
| 2002/0187074 A1 | 12/2002 | O'Connor |
| 2002/0187560 A1 | 12/2002 | Pezzuto |
| 2002/0190396 A1 * | 12/2002 | Brand ......................... 257/787 |

* cited by examiner

ELECTRONIC DEVICE MOUNTABLE ONTO A SUBSTRATE USING SURFACE MOUNT TECHNIQUES, AND METHOD

The invention relates to an electronic device comprising:

contact means for providing external contacts, which are present at a contacting side of the device;

a first sensing element provided with a reference plane, which includes a predefined angle to the contacting side of the device, a first electrical connection conductor that is coupled to both the contact means and the first sensing elements so as to provide an electrical interconnection, and an electrically insulating body of a desired shape engaged to position the first sensing element according to the predefined angle.

The invention also relates to the manufacture of an electronic device comprising a first sensing element having a reference plane, and an electrically insulating body of a desired shape engaged to position the first sensing element such that there is a predefined angle between the reference plane and a contacting side of the device, comprising the steps of:

providing a carrier having a first side and an opposed second side, at which first side a pattern of connection conductors is present, the carrier comprising means for external contacting;

assembling the first sensing element at the first side of the carrier and electrically coupling the first element to at least one of the connection conductors;

folding the carrier, thereby rotating the first sensing element with respect to the means for external contacting, so as to bring it in a position in which the reference plane of the sensing element and a plane through the means for external contacting mutually enclose the predefined angle.

Such a device and such a method are known from US-A 2002/0140422. The known device comprises a flexible carrier, that is provided with a first and an opposed second side. A first and a third sensing element are attached to the first side, and a second sensing element is attached to the second side. The sensing elements are magneto-resistive sensors and can be used for detection of a location in a specific direction. In order to measure a position in the three cartesian dimensions, the sensors need to enclose specific angles.

After attachment of the sensing elements the carrier is twice folded to obtain a J-like shape, such that the first and the third element mutually face each other, their substrates enclosing an angle of 180 degrees. The second element is located perpendicularly to both the first and the third element. The first and the third elements have a different in-plane position, such that they are able to measure in two mutually orthogonal directions. A housing of substantially cylindrical shape is applied around the folded carrier and the elements. Electrically insulating bodies of predefined shape are provided at opposed ends of the housing, so as to keep the sensing elements in place and in their individual positions. The carrier however extends to one side of the housing so as to provide contacts to the outside.

A disadvantage hereof is that the resulting device cannot be mounted on a substrate by using surface mount techniques. The substantially cylindrical housing does not have any contacts except at the carrier. The carrier is thus to be attached to a printed circuit board using any conducting attachment means, such as anisotropically conducting glue or adhesive. However, this adhesion step might exert a force on the carrier, leading to comparatively small displacements of the sensing elements and hence possibly to malfunctioning of the device. Alternatively, a separate flex foil is to be attached to the carrier. This however is an expensive solution.

It is therefore a first objective of the invention to provide an electronic device that is mountable onto a substrate using surface mount techniques.

The first object is achieved in that the electrically insulating body encapsulates the first sensing element and in that the contacting side of the device is a face of the body.

The primary characterizing feature of the device of the invention is that the electrically insulating body is not just an insert, but a body that encapsulates the first sensing element. It thus defines the internal constitution of the device, and particularly the angle between the reference plane of the sensing element and the contacting side. In addition, as a consequence of the encapsulation, a separate housing needed for keeping the parts together is not necessary anymore. Hence, any face of the body can be chosen as the contacting side.

The device of the invention is furthermore based on the insight that opposite sides of the connection conductors can be used for the provision of contacts. On one side, the sensing elements are attached, and on the opposite side, the means for external contacting are provided. The connection from one side of the carrier to the opposite side can be made in different ways. First of all, use can be made of a carrier with a sacrificial layer that is removed after the provision of the body. Secondly, use can be made of a flexible carrier which includes a vertical interconnect through the carrier foil. Thirdly, use can be made of wireless electrical connection means, the wireless means being defined as part of the pattern of conductors. The wireless means can be used instead of a vertical interconnect; in this case capacitive coupling is a good implementation. The wireless means can also be used for coupling the device to an external reader.

It is a first advantage of the device of the invention that the mechanical and chemical protection is improved. The known device, which is assembled from discrete parts, has the risk that, due to an external force or pressure, it falls apart into the constituent parts.

The part of the flexible carrier outside the housing may get locked and exert a pressure, or the housing itself may be moved or taken away. This is not the case with the device of the invention, which is constituted, in essence, by the insulating body.

Furthermore, humidity and the like may penetrate the device along the interfaces of the housing, the carrier and the inserted body. It seems therefore that each of the sensing elements is assembled only after it has been encapsulated. In the device of the invention, the body is also the encapsulation. This encapsulation can be chosen so as to have adequate resistance to moisture and other undesired contaminants. There is no need to assemble the sensing elements only after encapsulation.

It is a further advantage of the device of the invention that mounting the device to an external board is substantially improved. The predefined angle allows the device to be mounted on any available board, while the sensing direction can be independent of the orientation of this external board. In other words, it is an important advantage of the device of the invention that the predefined angle can be any angle between 0 and 360 degrees. This also provides the suitable feature that—contrary to the known device—less than three sensing elements are present in the device.

In a preferred embodiment the first connection conductor extends from the contacting side to a first side face of the body, where it is coupled to the first sensing element, and the contacting side and the first side face mutually enclose the predefined angle. In this embodiment the first side face of the body is oriented substantially parallel to the reference plane of the first sensing element. This is advantageous in view of the easy manufacture thereof. Particularly, the use of a sacrificial layer is allowed.

The sensing element in the device is a sensor for a magnetic field in particular. Magnetic fields are interesting media for determining the position, speed and/or acceleration of an apparatus, such as a car, a mobile phone. Magnetic fields are furthermore suitable for sensing in medical applications. Particularly preferred magnetic field sensors are magneto-resistive sensors, which are known in different types including AMR, GMR and TMR.

In a further embodiment, the insulating body has a second side face which encloses a predefined angle with respect to the first side face, a second electrical connection conductor extending from the second side face to the contacting side and a second sensing element electrically coupled to connection conductors at the second side face. In this embodiment a device with at least two sensing elements is provided that have a predetermined position relative to each other.

In an even further embodiment, a third sensing element is present at the first side face, the first, second and third sensing elements being sensors for a magnetic field, and the first and third sensors being suitable for sensing in two orthogonal directions. The device of this embodiment is suitable for sensing in three directions. This makes it suitable for use in apparatus in which none of the three cartesian directions is solidified. Examples of such apparatus are portable, handheld terminals, such as mobile phones, portable computers and the like.

In another embodiment further elements can be embedded in the body. These further elements can be passive components, but also signal processing units to process the signals of the sensing elements. Such elements can be provided at a suitable position, also at the position at the contacting side.

It is a second objective of the invention to provide a method of the kind described in the opening paragraph, in which a plurality of devices can be manufactured simultaneously and which leads to an electronic device comprising a first sensing element that is mountable onto a substrate using surface mount techniques.

This object is achieved in that the method comprises the steps of:
  providing a carrier having a first side and an opposed second side, at which first side a pattern of connection conductors is present, the carrier comprising contact means for external contacting;
  assembling the first sensing element at the first side of the carrier and electrically coupling the first element to at least one of the connection conductors;
  encapsulating the first element into a first molded structure using a molding technique, such that the molded structure has a predefined shape and is provided with a first and a second top face; and
  folding the carrier, thereby rotating the first molded structure with respect to the means for external contacting, so as to bring the first molded structure in a position in which the reference plane of the sensing element and a plane through the means for external contacting mutually enclose the predefined angle, in which positions the first top face is attached to the carrier or any structure present thereon, thereby forming the electrically insulating body, one side of which acts as contacting side at which the contact means are present.

In the method of the invention, the first element is encapsulated into a first molded structure. This molded structure, after the attachment to the carrier or any body present thereon, forms the electrically insulating body of the device. The molded structure and possibly the body on the carrier have a shape that allows a good positioning and preferably a good adhesion.

The method of the invention differs from that of the prior art in that the first element is encapsulated. Furthermore, it is through the molded structure that the angle between the reference plane of the first element and the contacting side is defined.

The first element may be encapsulated after the folding operation instead of before. Then the insulating body can be provided as a whole, instead of as a number of parts of specific shapes that need to be assembled thereafter. However this has some disadvantages. Firstly, it is not certain that such molding will lead to a good encapsulation. Secondly, if more than one sensing element is provided, there is the problem of mechanical stability since the bent structure must be positioned in a mould. Thirdly, molding cannot be done at wafer level, but must be done after the devices have been separated into individual devices or perhaps rows of devices.

Several methods can alternatively and additionally be used for a proper adhesion of the first molded structure to the carrier or any body present thereon. Firstly, use can be made of heat, so as to link the structure to the carrier chemically. Secondly, use can be made of curing or some chemical reaction by means of irradiation, particularly irradiation from the UV-spectrum. Thirdly, use can be made of a proper adhesive. Fourthly, use can be made of some kind of mechanical adhesion, which is provided as part of the molded structure. Not only clamping means and the like are possible, but also corresponding shapes and key and lock combinations. The most simple version thereof is that the body and the first molded structure are designed such as to form a mechanically stable assembly after the folding of the first molded structure, i.e. the first molded structure is not only supported by the carrier, but by the body acting as a kind of side wall.

In a preferred embodiment the carrier comprises a base material which, after the encapsulation step, is removed at least partially, so as to provide contact windows from the first side to the second side. As explained with reference to the device, several types of carriers can be used as the flexible carrier. The use of a base material which is removed at least partially, is advantageous. This allows not only for good contacts, but also, the base material is a suitable carrier as long as the encapsulation is not provided. It is even preferred that substantially the complete layer of base material is removed. This has the advantage that there is no need of patterning the layer, and hence no need to apply any photolithographic masks and steps.

The base material may be removed after or before the folding operation. The advantage of removing the base material before the folding operation is that it can be done also before separating the carrier with the elements into individual devices to be folded. For reasons of mechanical stability, it is therefore preferred that the carrier is provided in certain areas with a layer of an elastic material. The elastic material, such as a polyimide, allows the folding of the carrier. It is a matter of design and further engineering to determine at which areas such a layer of elastic material is undesirable, and at which areas for instance parallel to the contacting side—a rigid material would be preferred. In an even further embodiment, only one material is provided, in one operation, that is sufficiently elastic to allow folding, but sufficiently rigid to maintain its outer shape. In the attachment step after the folding operation this one material is then cured to provide one electrically insulating body.

The removal of the base material does not have to cause damage to the pattern of conductors. It is preferable anyway that the pattern of conductors is mechanically anchored in the molded structure and thus in (?) the electrically insulating body for proper adhesion. A suitable way of mechanically anchoring involves partial etching of the base layer before provision of the electrically insulating material in the molding step. This partial etching will lead to the under-etching of the conductors. The electrically insulating material will flow in the spaces thus created. This has the result that the conductors are present in recesses in comparison with the surface of the body of electrically insulating material. A suitable combination is Al as base material and conductors of Cu. Alternatives are the reverse, the use of Fe—Ni or steel as base material, the use of the same material for both with a barrier layer in between, or even the use of an organic layer that can be selectively removed with respect to the body.

In a preferred embodiment a second sensing element having a reference plane is assembled at the first side of the carrier and electrically coupled to at least one of the connection conductors, after which it is encapsulated, using a molding technique, into a second molded structure provided with a predefined shape comprising a first and a second top face. The carrier is then folded such that the second molded structure is rotated with respect to the first molded structure, so as to position the molded structures with respect to the means for external contacting such as to bring the first molded structure in a position in which the reference planes of the first and second sensing elements enclose the predefined angle, in which positions the first top face is attached to the carrier or any body thereon, and the second top faces face each other.

With this embodiment, more than one sensing element is provided. The shapes of both molded structures are defined with respect to each other, and may contain any means for mechanical attachment to each other. According to a preferred modification of this embodiment the second top faces are in contact with each other after the folding operation.

The invention further relates to a semi-manufactured article, which comprises a plurality of elements after encapsulating but before folding.

These and other aspects of the electronic device, the semi-manufactured article and the method of the invention will be further explained with reference to the drawings in which.

The Figures are not drawn to scale and identical reference numerals in different Figures refer to the same or similar parts.

Figure 1:
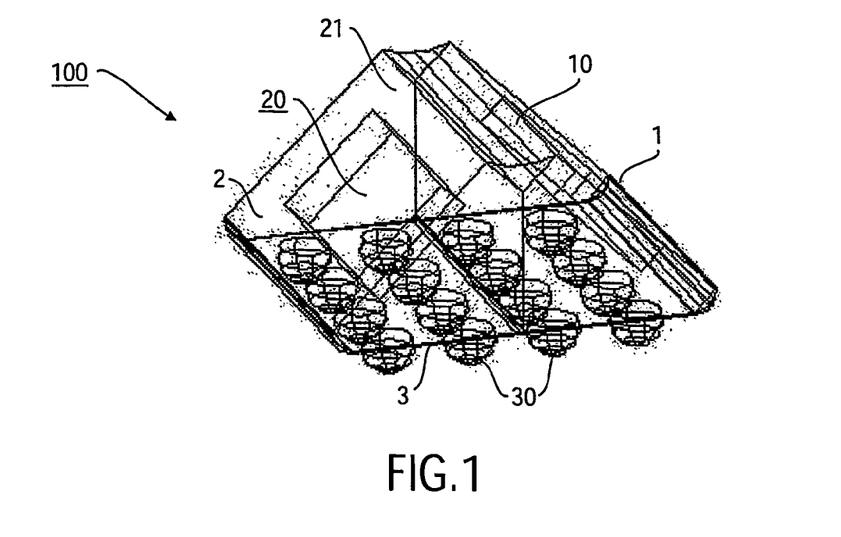
FIG. 1 shows a perspective, diagrammatical view of the electronic device.

FIG. 1 shows a diagrammatical, perspective view on the electronic device 100. In this example, but that is not essential, the device 100 is provided with a first sensing element 10 at a first side face 1, and with a second sensing element 20 at a second side face 2. Reference planes through the sensing elements 10, 20 are in this case oriented in parallel with the side faces 1, 2, and mutually enclose a predefined angle of in this case 90°. The sensing elements 10, 20 are in this case constituted by magneto-resistive sensors which are known per se. Particularly, each sensing element comprises a plurality of magneto-resistive sensor elements connected together to form a Wheatstone bridge circuit and situated in one plane, each of the sensor elements within one sensing element having the same privileged direction of magnetization. Preferably four magneto-resistive sensors elements are provided per sensing element. It is suitable that a silicon substrate is used and that the sensor elements are formed by a meander-like strip of permalloy having a privileged direction of magnetization parallel to the longitudinal direction of the strip. The ends of the sensor elements are interconnected so that they form the four branches of a Wheatstone bridge. The degree of unbalance of the bridge can be used as a measure of the variation of the magnetic field strength in the reference plane of the sensor elements and perpendicularly to the direction of an electric current flowing through the sensor elements. The bridge circuit is coupled on one side to a power supply circuit and on the other side to a signal processing circuit Suitable signal processing circuits are known per se to the skilled person.

The sensing elements 10, 20 are encapsulated by an electrically insulating body 21. The device 100 is further provided with a contacting side 3 at which contact means 30 are present. The contact means are in this case solder balls of a suitable composition, which are electrically connected to contact pads (not shown). These contact pads are part of a pattern of electrical conductors 52 (not shown), which is present near or at the surface of the body 21. A first conductor extends from the first side face 1 to the contacting side 3 and a second conductor extends from the second side face 2 to the contacting side 3. The pattern of conductors further includes contact pads to the sensing elements 10, 20, such that the first and the second conductor are electrically coupled to the first and the second sensing element 10, 20, respectively. These conductors are further coupled electrically to the contact means 30. In addition to the first and the second sensing element 10, 20, a third sensing element may be present. Such a third sensing element is located at the same side face as the first sensing element 10, but directed differently. Particularly, the first and third sensing elements will be directed orthogonally, so that the first, second and third sensing elements are directed in the three cartesian directions.

Figure 2:
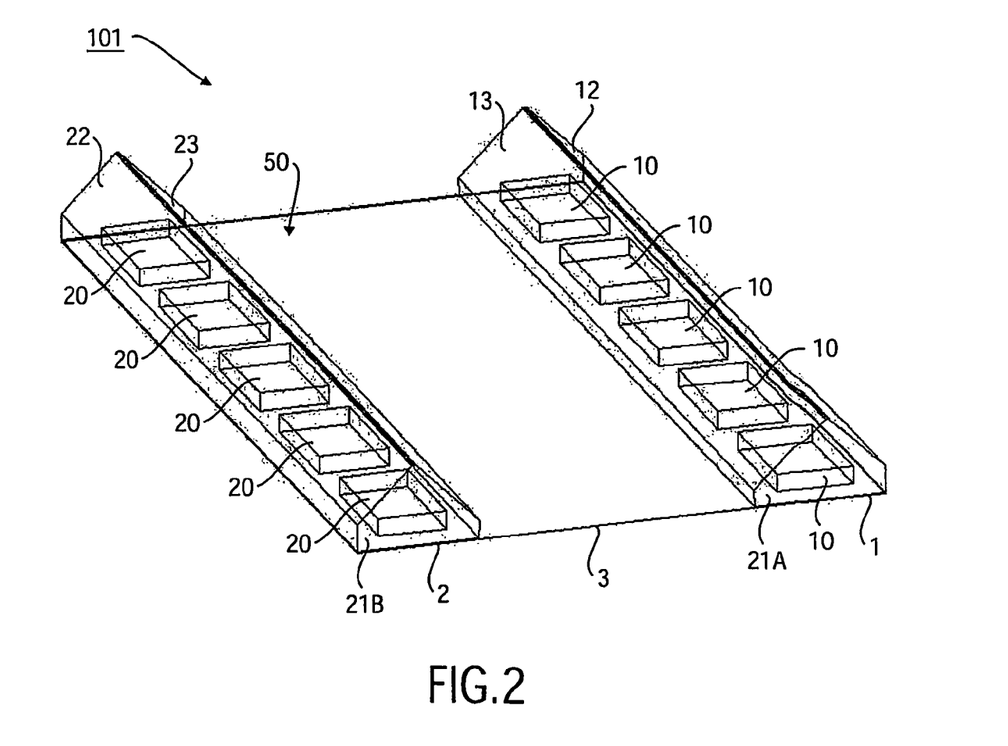
FIG. 2 shows a perspective, diagrammatical view of the semi-manufactured article.

FIG. 2 shows diagrammatically a perspective view on the semi-manufactured article 101 of the invention. This article 101 comprises a plurality of first sensing elements 10 and second sensing elements 20. Although the shown article 101 corresponds to a single row of devices 100, it may extend laterally. The first sensing elements 10 are encapsulated by electrically insulating material into a first molded structure 21A. The second sensing elements 20 are encapsulated by electrically insulating material into a second molded structure 21B. Each of the molded structures 21A, 21B is provided with respectively a first top face 12, 22 and a second top face 13, 23. The molded structures 21A, 21B are kept together by a carrier 50. This carrier 50 also carries the pattern of conductors. Within the carrier 50 three areas can be defined, corresponding to the first side face 1, the second side face 2 and the contacting side 3. Although not shown here, the carrier 50 may be provided with an elastic top layer.

The device 100 as shown in FIG. 1 can be obtained from the semi-manufactured article 101 in that the article 101 is folded, separated into individual devices and provided with contact means. In this case the separation step is preferably carried out after the folding step, as the article 101 comprises just a single row of devices 100. However, if the article were to comprise a plurality of rows, any separation is necessary before the folding step. In the folding step, the first and the second molded structures 21A, 21B are rotated with respect to the contacting side 3, such that the first top faces 12, 22 face each other and the second top faces 13, 23 face the carrier 50. By a suitable adhering step, for instance a heat treatment, the first and second molded structures 21A, 21B are attached to each other and the carrier 50, thereby forming the body 21 with its respective contacting side 3, and its first and second side faces 1, 2. The contact means 3 could contain a suitable anisotropically conductive adhesive, metal or alloy or paste with conducting particles instead of solder. Also a suitable foil could be used. It is further observed that the contact means 3 include not only the solder balls, but possibly also contact pads in the pattern of conductors and a suitable adhesion layer. Contact means are presumed to be present, without any solder balls or the like being attached.

As will be understood, the semi-manufactured article 101 is suitable as well for the provision of devices with only a single, first sensing element 10. In that case, the semi-manufactured article 101 is subdivided in a different way, and there is more freedom of rotation. Particularly in that case it is possible as well that not the molded structures 21A, 21B are rotated with respect to the contacting side 3, but that the free part of the carrier 50 is folded with respect to the molded structures 21A or 21B, respectively. In that case, a further structure may be present on top of the carrier, acting as a corresponding structure to the molded structure 21A, 21B.

FIGS. 3a-e show results after a number of consecutive steps in the method of the invention. The Figures are related to a specific embodiment of the method of the invention, in which a carrier 50 is used with a pattern of conductors 52 and a base layer 51. In this case use is made of Al for the base layer 51 and copper for the conductors 52. This is not necessary however. A suitable alternative is the use of a three layered carrier comprising for instance copper, aluminum and copper. At both sides thereof layers of NiPd or NiAu or Sn may be provided, acting both as lithographic masks and as adhesion layers. Alternatively, use could be made of a base layer of silicon or glass, that can be removed by grinding and etching. Also use can be made of a base layer that is connected to the pattern of conductors through a UV-releasable foil. Furthermore, use can be made as well of a carrier 50, which is a single layered or multi-layered flexible board with internal vertical interconnects extending from the first side 58 to the second side 59.

Figure 3A:
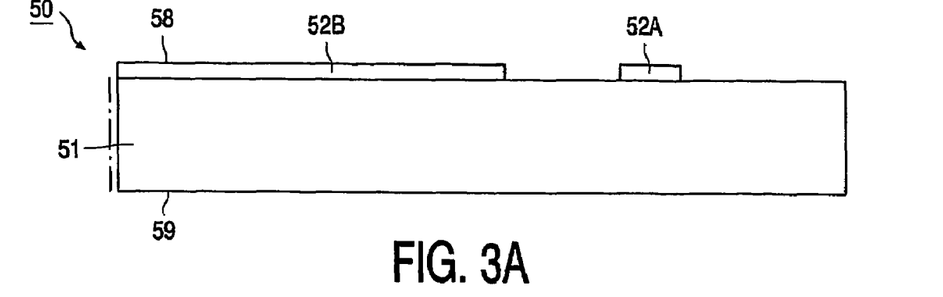
FIGS. 3*a-e* show diagrammatical, cross-sectional views of the device after several steps in the method.

FIG. 3a shows a cross-sectional view of the carrier 50 having a first and a second side 58, 59 opposite to each other. The carrier comprises a base layer 51, here of Al or an aluminum alloy, and a pattern of conductors 52 including individual conductors 52A, 52B. The conductor 52B functions here as an interconnect and will extend from the first side of the body to the connecting side. The base layer will have a suitable thickness so as to act as a mechanical support. Its thickness is for instance in the range of 20 to 100 µm, preferably 30 to 60 µm. The pattern of conductors generally has a thickness, and thus a resolution, in the order of 1 to 30 µm, preferably 5 to 15 µm. Generally, it will be provided with an adhesion layer for improvement of the adhesion to solder balls. The material of the adhesion layer depends on the material of the solder balls, as is known by the skilled person. Materials generally used for adhesion layers include NiAu, Sn and the like.

Figure 3B:
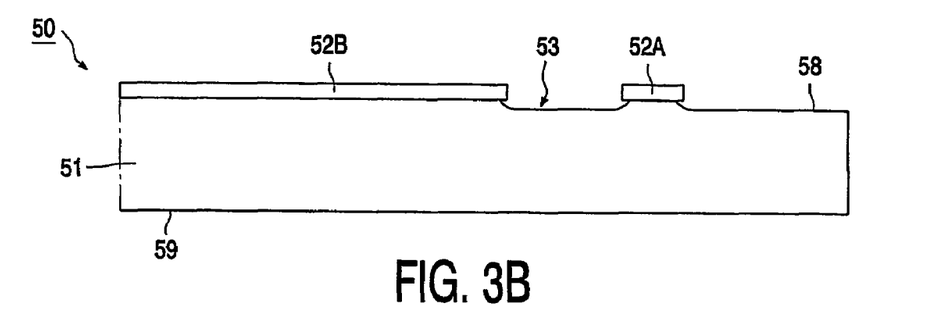

FIG. 3b shows a cross-sectional view of the carrier 50 after an etching step, whereby the conductors 52A, 52B are provided with under-etched spaces 53. This etching step is done using a solution of sodium hydroxide, whereas the copper is patterned with ferrichloride. These etchants are selective to aluminum and copper respectively.

Figure 3C:
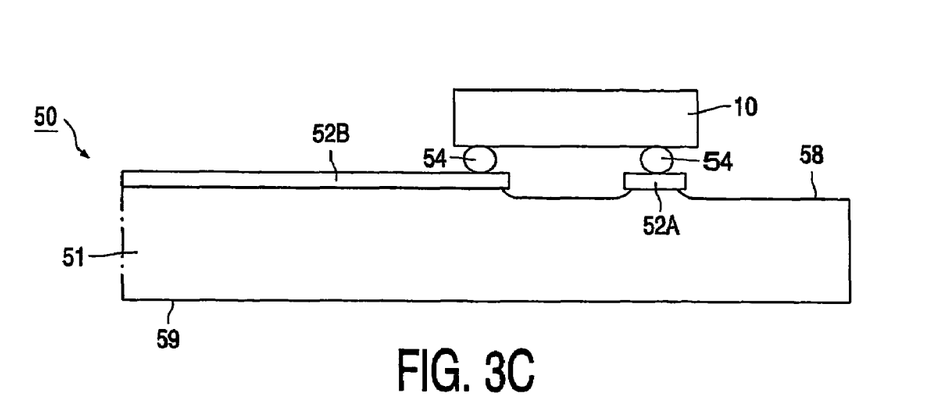

FIG. 3c shows a cross-sectional view of the carrier 50 after a first sensing element 10 has been provided on the conductors 52A, 52B with intermediate solder balls 54. It is through definition of the contact pads in the copper pattern that the position of the sensing element 10 in the final device is defined, at least partially. Use can be made of sensing elements 10 that have not been encapsulated beforehand (e.g. naked dies). In order to provide a good connection, use can be made of solder processes in which solder material is provided both at the pattern of conductors and at the contact pads of the sensing element. Furthermore, use can be made of alternative connection techniques, such as Ultra Sonic bonding, conductive glues and particularly wire bonding. In order to establish a good electrical connection between the solder balls 54 and the pattern of conductors 52, a heating step is usually carried out. This heating step can be applied either before or after molding, as is known to the skilled person. Use is preferably made of a reflow oven.

Figure 3D:
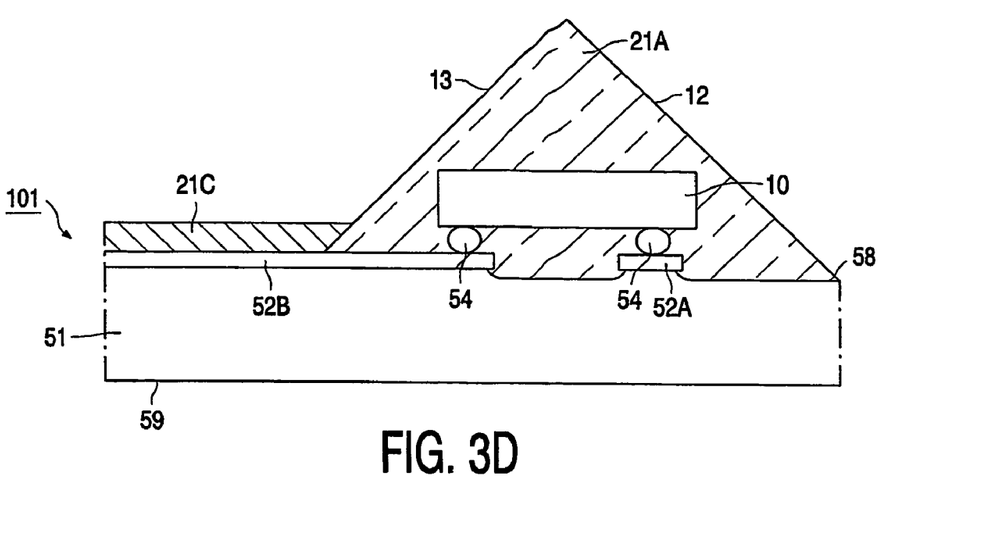

FIG. 3d shows a cross-sectional view after encapsulation steps. As a result, the carrier 50 is transformed into the semi-manufactured article 101. In this case, use is made of encapsulation steps. The first encapsulation step, carried out using a molding technique such as insert molding or transfer molding, encapsulates the first sensing element 10 and results in the first molded structure 21A with a first and a second top face 12, 13. For the electrically insulating material use can be made of glass-filled epoxies and of engineering plastics such as polyphenylenesulfide (PPS). Other suitable materials are known to the skilled person. This material will depend on the type of molding process used.

The second encapsulation step can be carried out using a molding technique, but alternatively use may be made of any other type of deposition technique, including spincoating, webcoating, sputtering, various forms of printing. The material used therefor may be an organic material, a polymer material or an inorganic material. A material that is primarily an adhesive or the adhesive properties of which increase on heating, is preferred. Flexible materials are highly preferred. Good examples are acrylates, silicon rubbers, polyimides, Parylene and for instance materials which are also used for wafer coating purposes. This material may also be an underfill type material, which is generally used to fill spaces between the sensing element 10 and the carrier 50.

The second encapsulation step must not necessarily take place after the first step. On the contrary, a very good embodiment is achieved by using a material that melts on heating and thus allows solder balls to sink through this layer. Such a layer is for instance an acrylate and is preferably provided, for instance by spincoating or as a film, before the provision of the sensing element 10. It is even possible that the first and second encapsulation steps are integrated into one step, or that the structure 21C is not provided at all. The latter is particularly suitable if the base layer 51 is removed only after folding.

Figure 3E:
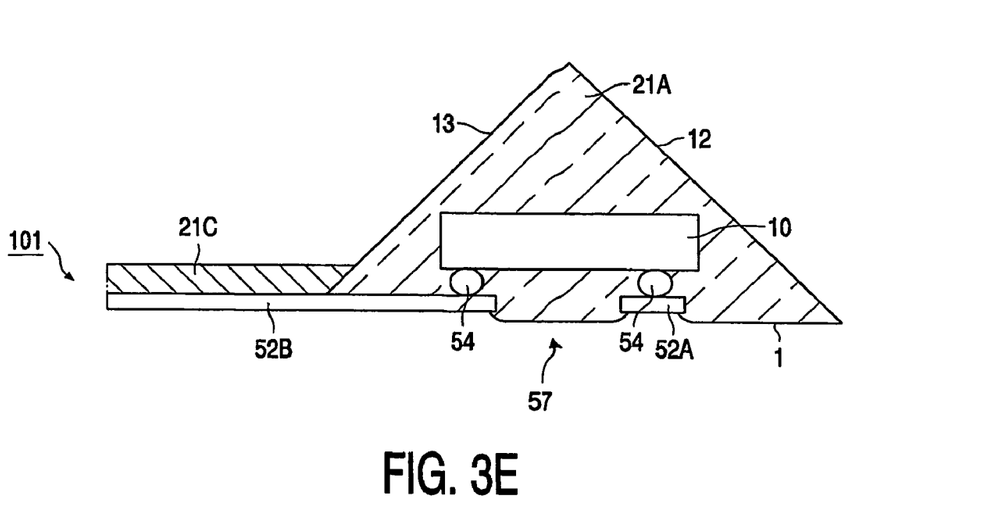

FIG. 3e shows the semi-manufactured article 101 after removal of the base layer 51. This removal is for instance done by grinding and wet-chemical etching. As a result, the under-etched spaces, which have been filled with the electrically insulating material, are provided at the surface 1 as protruding portions 57 which at the same time provide mechanical anchoring of the conductors 52A, 52B.

Figure 4:
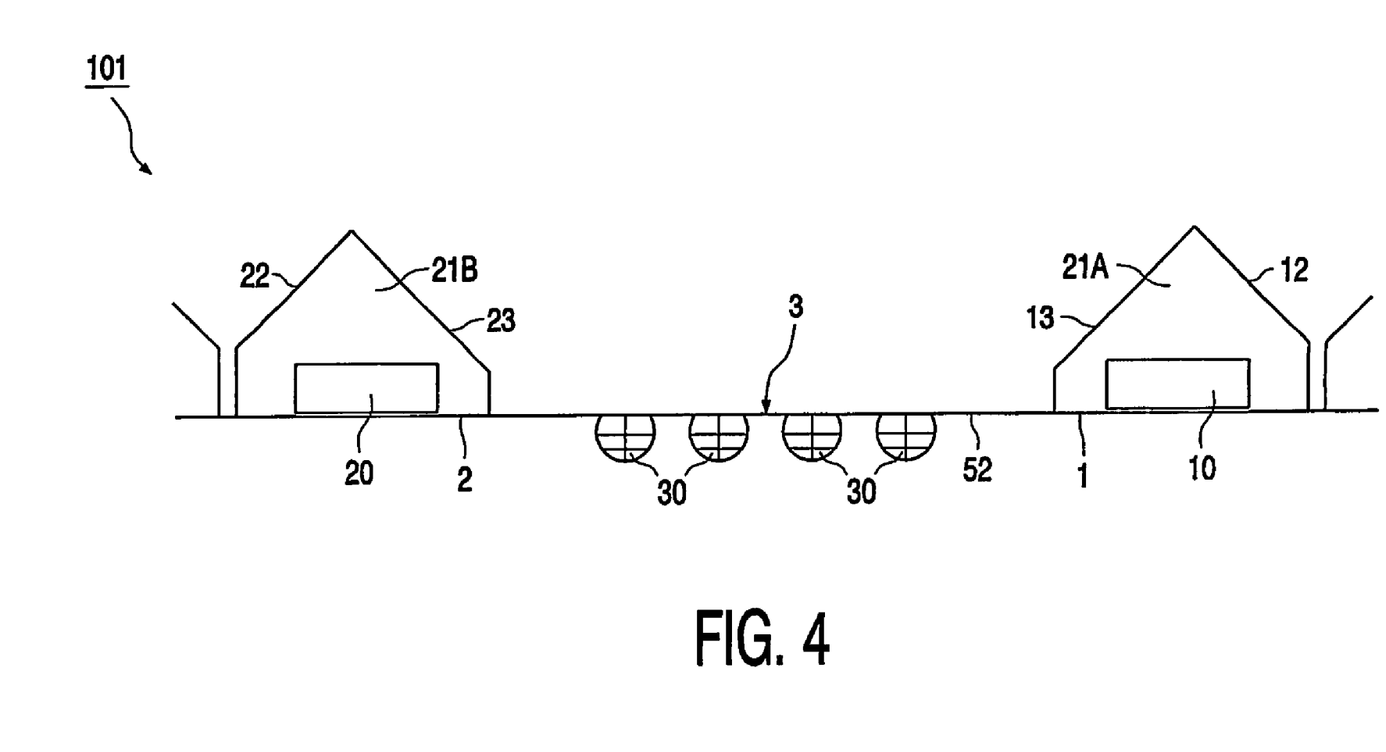
FIG. 4 shows the same as FIG. 3*a*, but on a larger scale.

FIG. 4 shows a cross-sectional view of the semi-manufactured article 101 at the same stage, however on a larger scale and after the provision of contact means 30, in this case solder balls. In addition to the first molded structure 21A a second molded structure 21B is present having a second sensing element 20 and a first and second top face 22, 23. Indicated are the areas corresponding to the first and second side face 1,2 and the contacting side 3. Conductors 52 extend so as to provide the interconnection.

Figure 5:
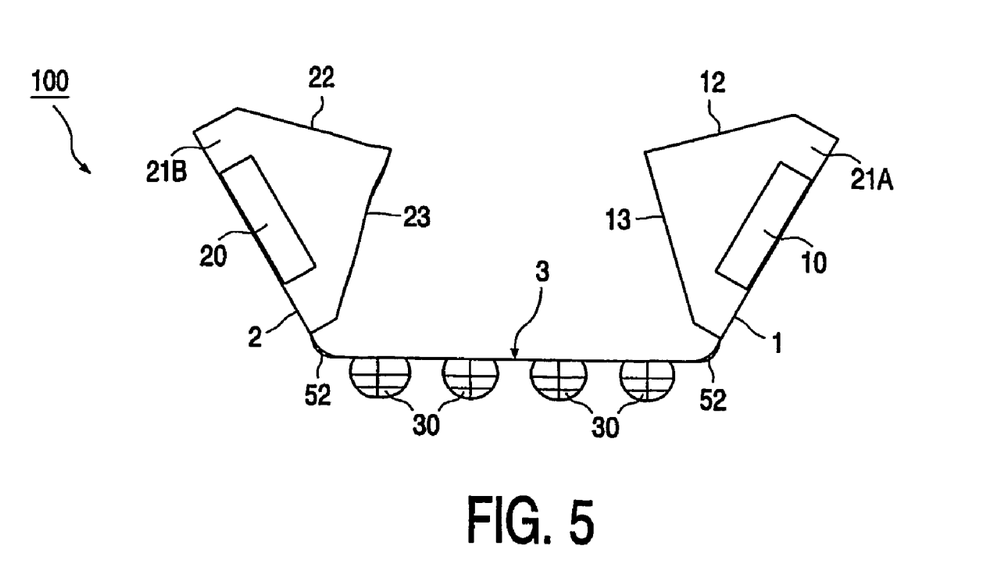
FIG. 5 shows a diagrammatical, cross-sectional view of the device during the folding step.

FIG. 5 shows a cross-sectional view of the device 100, after subdivision into rows of devices or individual devices, during the folding step. Herein, the first and second molded structure 21A, 21B are rotated. The folding process of this embodiment includes simultaneous rotation of both molded structures 21A, 21B. This is not necessary however. Preferably, a specific tool is used for the folding, which is shown in FIGS. 7a-d.

Figure 6:
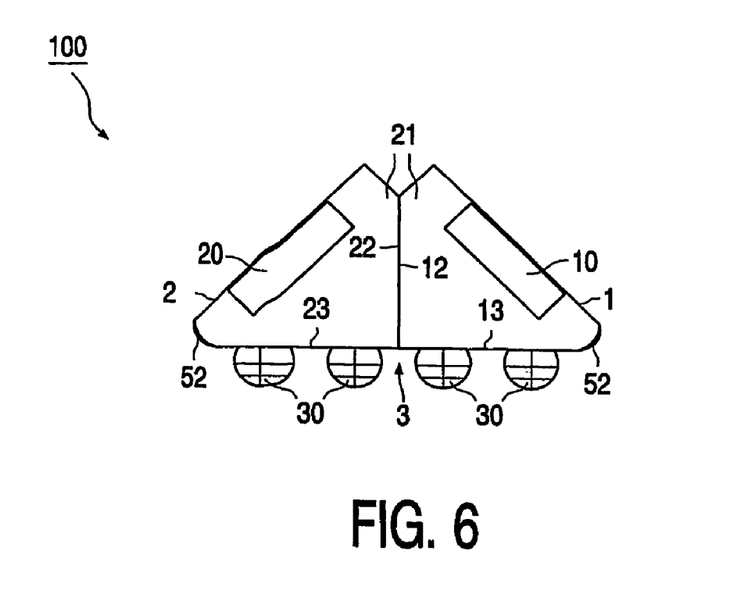
FIG. 6 shows a diagrammatical, cross-sectional view of the device after the folding step.

FIG. 6 shows a cross-sectional view of the device 100 after completion of the rotation step and attachment of the molded structures to each other and to the carrier, thereby providing the electrically insulating body. As a result, the first top faces 12, 22 of the molded structures face each other, whereas the second top faces 13, 23 face the carrier. The adhesion is brought about in this case by a heating step. Usually, the materials chosen for the molding structures will be thermoset, e.g. they will be thermally stable and do not melt on heating. Generally this is achieved by cross linking the polymeric chains in known manner. To improve the adhesion it is preferred to use mechanical anchoring or to apply of a thin layer of adhesive. Such adhesive is able to fixate the conductor tracks, resulting in an embodiment in which no flexible part is needed.

Although not shown here, it is generally preferred within such devices that a magnetization coil is present. The magnetization coil can be part of the pattern of conductors and be located parallel to the contacting side of the device. If desired, this coil can be covered by a medium having a high magnetic susceptibility, such as a layer of ferrite material, or an organic material with ferrite or other magnetic particles embedded therein. This magnetization coil is present to produce an auxiliary magnetic field parallel to a central axis.

Preferably, it is positioned such that an angle enclosed by the central axis relative to a normal to the plane of the sensing elements is the same for each of the sensing elements, i.e. the angle α in between 0 and 90°. The preferred location of the coil is chosen such that the auxiliary magnetic field at the area of each of the sensing elements contains a component which extends parallel to the privileged direction of magnetization of the magnetic field sensor elements of the relevant sensing element.

FIGS. 7a-d show diagrammatically and in cross-section the device 100 of the invention during the folding step, and a tool 200 adapted for implementation of the folding step. The tool 200 comprises a top part 201, at least one bottom part 202 and a support 203. The bottom part 202 can be constructed as a single part that surrounds the support 203. However, it may also be constructed as several parts that cooperate. The tool is preferably provided with motors and any kind of necessary equipment so as to allow movement of the bottom part 202, the top part 201 and the support 203 in the vertical direction with respect to each other. The tool 200 may include further functions, such as transport and separation. The terms bottom part and top part are used herein for clarity and in conformity with the preferred embodiment. However, it is not excluded that the tool is used upside down, or that the bottom and top part 201, 202 are located transversely to the support 203, in a suitable construction.

Figure 7A:
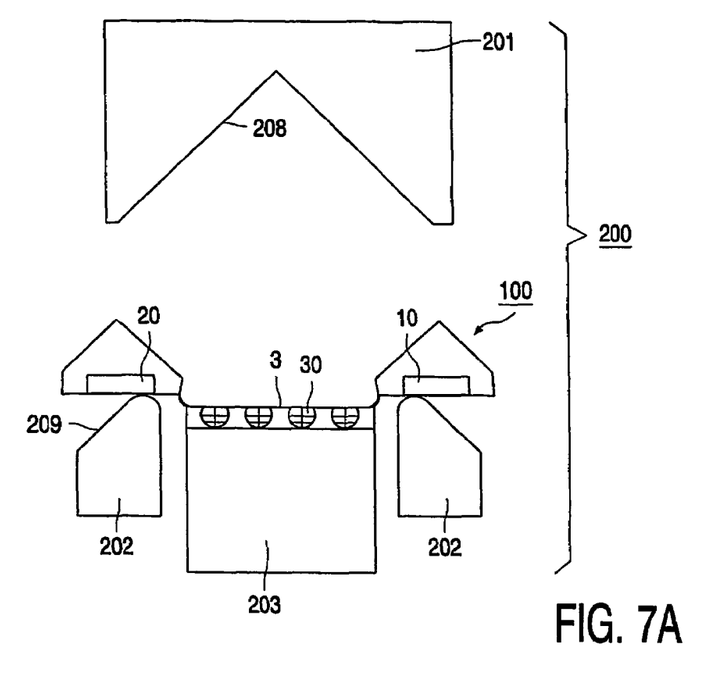
FIGS. 7*a-d* show diagrammatical, cross-sectional views of the folding steps and a specific tool for folding.

FIG. 7a shows the device 100 with the tool 200 before the folding operation. The device 100 in this case is provided with solder bumps 30, which could alternatively be applied after the folding operation. The top part 201 comprises an inner surface 208, and the bottom part 202 comprises an upper surface 209. These surfaces 208, 209 are complementary. The shape of the inner surface 208 is chosen so as to correspond to the desired angle between the first and second sensing element 20. The choice of this angle was explained above.

Figure 7B:
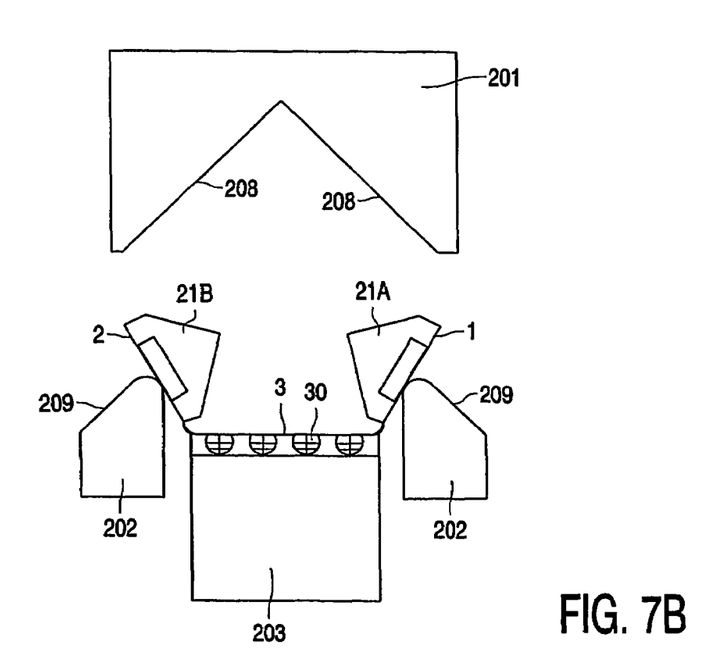

FIG. 7b explains the first step, in which the bottom part 202 is moved with respect to the support 203. As a result the upper surfaces 209 of the bottom part 202 push the faces 1,2 of the bodies 21A and 21B. As a consequence, the bodies 21A and 21B are rotated. The upper surfaces 209 are provided with rounded edges so as to prevent any damage. The force and speed of the movement of the bottom part 202 can be chosen so as to optimize the process, as will be clear to the skilled person. It is moreover dependent on the degree of flexibility of the foil 3.

Figure 7C:
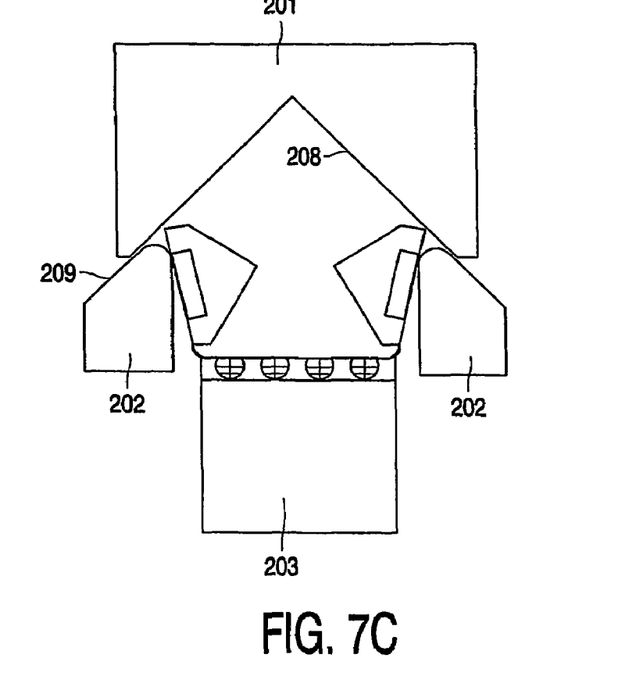

FIG. 7c shows the second step, in which the top part 201 is moved towards the bottom part 202. The corresponding shapes of the upper surface 208 and the inner surface 209 ensure that the bottom and top part 202, 201 are properly aligned, and that the force and speed with which the top part 201 is moved towards the device 100 can be balanced by the bottom part 202.

Figure 7D:
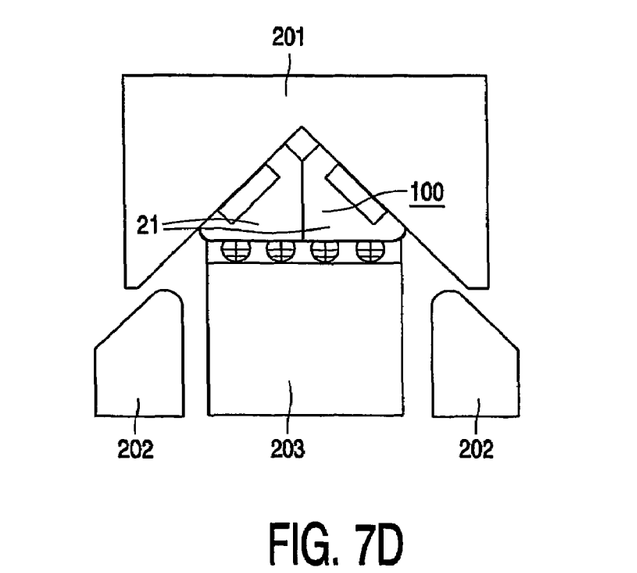

FIG. 7d shows the third and final step, in which the support 203 is moved with respect to the top part 201, or alternatively, the bottom and top part 202, 201 are moved towards the support 203. As a consequence, the bodies 21A, 21B are joined together to form the body 21. In order to provide any adhesive, the top part 201 can be provided with one or more distribution channels. However, such adhesive might alternatively be applied before the folding process.

In short the sensing device 100 of the invention comprises a first sensing element 10 having a reference plane 1, between which sensing element 10 and a contacting side 3 of the device 100 a predefined angle is present. Conductors couple the sensing element 10 to external contacting means 30. The sensing device 100 is further provided with a body 21, which encapsulates the first sensing element 10 and at the same time acts as a carrier for the conductors, so that the contacting side 3 is a face of the body 21. The sensing device 100 may contain more than one sensing element 10, 20, which mutually include a predefined angle, the predefined angle to the contacting side 3 being of no or negligible importance. The sensing elements 10, 20 are by preference magneto-resistive sensors. The device 100 can be suitably manufactured in that parts 21A, 21B of the body 21 are rotated with respect to the contacting side 3, the parts 21A, 21B of the body having complementary shapes.

The invention claimed is:

1. An electronic device comprising:
   contact means for external contacting, which are present at a contacting side of the electronic device;
   a first sensing element provided with a first reference plane, which defines a first predefined nonzero angle with the contacting side of the electronic device,
   a first electrical connection conductor that is coupled to both the contact means and the first sensing elements so as to provide a first electrical interconnection, and
   a first electrically insulating body positioning the first sensing element according to the first predefined nonzero angle,
   a second sensing element provided with a second reference plane which defines a second predefined nonzero angle with the contacting side of the electronic device, a second electrical connection conductor that is coupled to both the contact means and the second sensing elements so as to provide a second electrical interconnection, and a second electrically insulating body positioning the second sensing element according to the second redefined nonzero angle, wherein:

the first electrically insulating body encapsulates the first sensing element, the second electrically insulating body encapsulates the second sensing element, a first top face of the first electrically insulating body faces a second top face of the second electrically insulating body, a third top face of the first electrically insulating body faces the contacting side of the electronic device, and a fourth top face of the second electrically insulating body faces the contacting side of the electronic device.

2. The electronic device as claimed in claim 1, wherein at least one of the first sensing element and the second sensing element is suitable for sensing a magnetic field.

3. The electronic device as claimed in claim 1, wherein at least one of the first sensing element and the second sensing element comprises a magneto-resistive sensor.

4. A method of manufacturing an electronic device comprising a first sensing element having a first reference plane, and an electrically insulating body of a desired shape engaged to position the first sensing element such that there is a predefined nonzero angle between the first reference plane and a contacting side of the device, the method comprising the acts of:

providing a carrier having a first side and an opposed second side, at which first side a pattern of connection conductors is present, the carrier comprising contact means for external contacting;

assembling the first sensing element at the first side of the carrier and electrically coupling the first element to at least one of the connection conductors;

encapsulating the first sensing element with a molding technique into a first molded structure, such that the first molded structure has a first predefined shape and is provided with a first top face and a second top face;

folding the carrier, thereby rotating the first molded structure with respect to the means for external contacting, so as to bring the first molded structure in a position in which the first reference plane of the sensing element and a plane through the means for external contacting mutually enclose the predefined nonzero angle, in which position the first top face is attached to the carrier or any structure present thereon, thereby forming the electrically insulating body, one side of which acts as contacting side at which the contact means are present.

5. The method as claimed in claim 4, wherein, after the folding act, the first molded structure is fixed in its position by a gluing act.

6. the method as claimed in claim 4, wherein the carrier comprises a base material which, after the encapsulation act, is removed at least partially, so as to provide contact windows from the first side to the second side.

7. the method as claimed in claim 4, wherein:

a second sensing element having a second reference plane is assembled at the first side of the carrier and electrically coupled to at least one of the connection conductors, after which it is encapsulated, using the molding technique, into a second molded structure provided with a second predefined shape comprising a third top face and a fourth top face; and the carrier is folded such that the second molded structure is rotated with respect to the first molded structure, so as to position the first and second molded structures with respect to the means for external contacting such as to bring the first molded structure in a position in which the first and second reference planes of the first and second sensing elements enclose the predefined angle, in which positions the third top face is attached to the carrier or any body thereon, and the second and fourth top faces face each other.

8. the method as claimed in claim 7, wherein the second and fourth top faces are in contact with each other after the folding act.

9. method as claimed in claim 4, wherein a plurality of electronic devices are manufactured simultaneously, which are mutually separated after the folding act.

10. A semi-manufactured article comprising sensing elements on a carrier, which may be subdivided into a plurality of individual devices, wherein:

the carrier has a first side and an opposed second side, at which first side a repeated pattern of connection conductors is present, each pattern including, or corresponding to, means for external contacting;

sensing elements are present at the first side of the carrier, are electrically coupled to at least one of the connection conductors and are encapsulated, using a molding technique, into molded structures, such that the molded structures have predefined shapes and are provided with first top faces and second top faces, wherein the first top faces face each other and the second top faces face the first side of the carrier.

11. The semi-manufactured article of claim 10, wherein the molded structures include protruding portions which provide mechanical anchoring of the connection conductors.

12. The semi-manufactured article of claim 11, wherein the protruding portions extend beyond the connection conductors.

13. The electronic device of claim 1, wherein at least one of the first electrically insulating body and the second electrically insulating body includes a protruding portion which provides mechanical anchoring of at least one of the first electrical connection conductor and the second electrical connection conductor.

14. The electronic device of claim 13, wherein the protruding portion extends beyond the at least one of the first electrical connection conductor and the second electrical connection conductor.

* * * * *